(12) United States Patent
Katsuno et al.

(10) Patent No.: US 10,403,790 B2
(45) Date of Patent: Sep. 3, 2019

(54) METHOD FOR MANUFACTURING SEMICONDUCTOR LIGHT-EMITTING DEVICE

(71) Applicant: ALPAD CORPORATION, Tokyo (JP)

(72) Inventors: Hiroshi Katsuno, Komatsu Ishikawa (JP); Masakazu Sawano, Nonoichi Ishikawa (JP); Kazuyuki Miyabe, Kanazawa Ishikawa (JP)

(73) Assignee: ALPAD CORPORATION, Tokyo (JP)

( * ) Notice: Subject to any disclaimer, the term of this patent is extended or adjusted under 35 U.S.C. 154(b) by 0 days.

(21) Appl. No.: 16/153,325

(22) Filed: Oct. 5, 2018

(65) Prior Publication Data

US 2019/0051795 A1    Feb. 14, 2019

Related U.S. Application Data

(60) Division of application No. 15/875,887, filed on Jan. 19, 2018, now Pat. No. 10,128,408, which is a
(Continued)

(30) Foreign Application Priority Data

Jun. 15, 2015 (JP) .................................. 2015-120275

(51) Int. Cl.
*H01L 33/00* (2010.01)
*H01L 33/22* (2010.01)
(Continued)

(52) U.S. Cl.
CPC .............. *H01L 33/22* (2013.01); *H01L 33/20* (2013.01); *H01L 33/38* (2013.01); *H01L 33/44* (2013.01);
(Continued)

(58) Field of Classification Search
CPC ......... H01L 21/02365; H01L 21/02389; H01L 31/18; H01L 33/00; H01L 33/005;
(Continued)

(56) References Cited

U.S. PATENT DOCUMENTS 8,124,985 B2    2/2012    Sakai et al.
2006/0124954 A1    6/2006    Akaishi
(Continued)

FOREIGN PATENT DOCUMENTS

CN    103119735 A    5/2013
JP    H11214749 A    8/1999
(Continued)

OTHER PUBLICATIONS

Fujii et al., Increase in the extraction efficiency of GaN-based light-emitting diodes via surface roughening, Applied Physics Letters, vol. 64, No. 6, pp. 855-857, 2004.
(Continued)

*Primary Examiner* — Cuong Q Nguyen
(74) *Attorney, Agent, or Firm* — Kim & Stewart LLP

(57) ABSTRACT

A semiconductor light-emitting device includes a light-emitting member that includes a first semiconductor layer of a first conductivity type, a second semiconductor layer of a second conductivity type, and a light-emitting layer between the first semiconductor layer and the second semiconductor layer, a first metal layer electrically connected to the first semiconductor layer, and a second metal layer electrically connected to the second semiconductor layer. The light-emitting member has a first surface including a front surface of the first semiconductor layer, a second surface including a front surface of the second semiconductor layer, a side surface including an outer periphery of the first semiconductor layer, and a recess extending inwardly of the second surface to an interior portion of the first semiconductor layer
(Continued)

to expose an inner surface on a side of the recess facing the side surface.

12 Claims, 11 Drawing Sheets

Related U.S. Application Data continuation of application No. 15/055,255, filed on Feb. 26, 2016, now Pat. No. 9,911,899.

(51) Int. Cl.
*H01L 33/20* (2010.01)
*H01L 33/38* (2010.01)
*H01L 33/44* (2010.01)
*H01L 33/62* (2010.01)

(52) U.S. Cl.
CPC ........ *H01L 33/0079* (2013.01); *H01L 33/382* (2013.01); *H01L 33/62* (2013.01)

(58) Field of Classification Search
CPC ............. H01L 33/0054; H01L 33/0075; H01L 33/0041; H01L 33/0079; H01L 33/22; H01L 33/382

See application file for complete search history.

(56) References Cited

U.S. PATENT DOCUMENTS

| | | |
|---|---|---|
| 2008/0096297 A1 | 4/2008 | Schiaffino et al. |
| 2011/0062488 A1 | 3/2011 | Uemura et al. |
| 2012/0074441 A1* | 3/2012 | Seo ..................... H01L 33/0079 257/91 |
| 2012/0235168 A1 | 9/2012 | Katsuno et al. |
| 2014/0070263 A1 | 3/2014 | Choi et al. |
| 2014/0239341 A1 | 8/2014 | Matsumura |

FOREIGN PATENT DOCUMENTS

| | | |
|---|---|---|
| JP | H11354845 A | 12/1999 |
| JP | 2010507246 A | 3/2010 |
| JP | 201171444 | 4/2011 |
| JP | 2011198997 A | 10/2011 |
| JP | 2012195321 A | 10/2012 |
| JP | 2014195055 A | 10/2014 |

OTHER PUBLICATIONS

Taiwan Office Action dated Aug. 31, 2016, filed in Taiwan counterpart Application No. 105107255, 9 pages (with translation).

\* cited by examiner

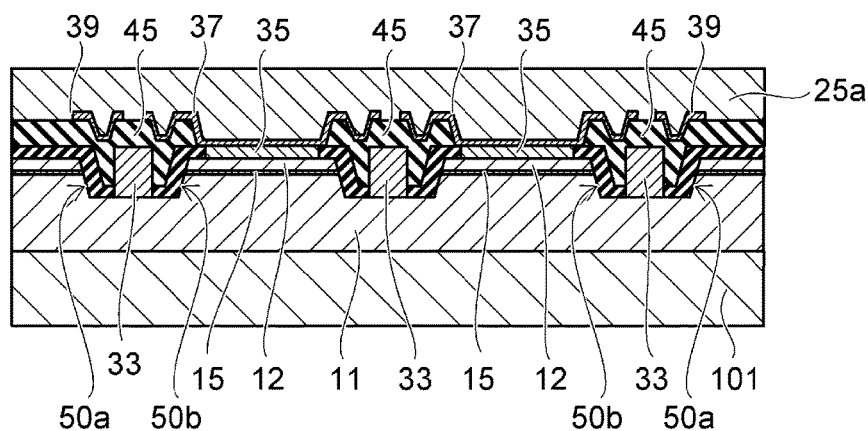
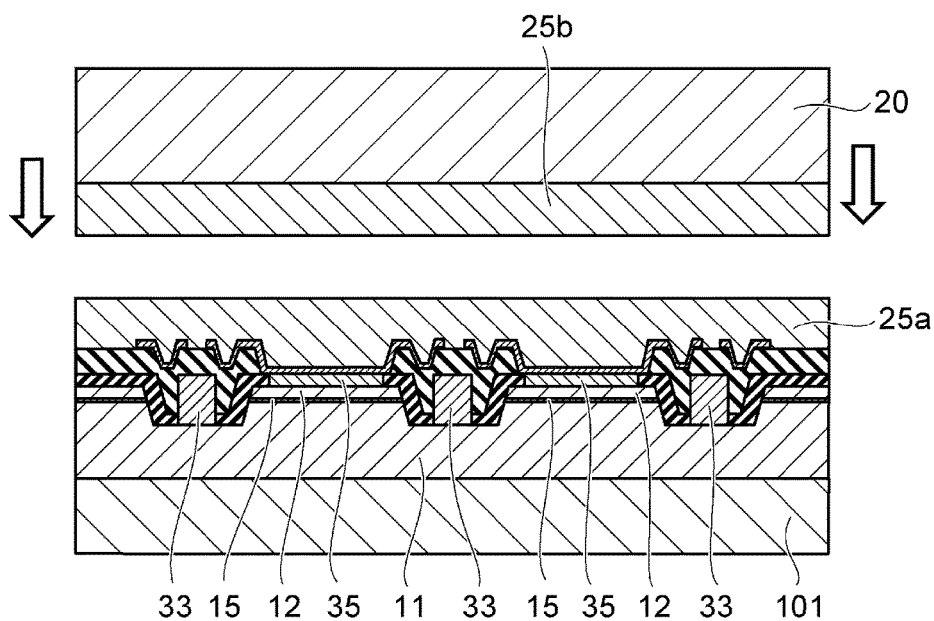

METHOD FOR MANUFACTURING SEMICONDUCTOR LIGHT-EMITTING DEVICE

CROSS-REFERENCE TO RELATED APPLICATIONS

This application is a division of U.S. patent application Ser. No. 15/875,887, filed on Jan. 19, 2018, which is a continuation of U.S. patent application Ser. No. 15/055,255, filed on Feb. 26, 2016, now U.S. Pat. No. 9,911,899, granted on Mar. 6, 2018, which is based upon and claims the benefit of priority from Japanese Patent Application No. 2015-120275, filed Jun. 15, 2015, the entire contents of each of which are incorporated herein by reference.

FIELD

Embodiments described herein relate generally to a semiconductor light-emitting device.

BACKGROUND

A semiconductor light-emitting device includes, for example, a light-emitting member in which a p-type semiconductor layer, a light-emitting layer, and an n-type semiconductor layer are stacked. Light emitted from the light-emitting member has high luminance in the layer stack direction. For this reason, it is necessary to improve luminance in a direction crossing the layer stack direction for uses of light-emitting devices requiring wide light dispersion. For example, when a wavelength of light emitted from the light-emitting layer is converted using one or more phosphors, it is necessary to improve luminous efficiency as a whole by exciting the phosphors arranged near the sides of the light-emitting member in addition to the phosphors located in the stack direction.

DESCRIPTION OF THE DRAWINGS

FIGS. 6A and 6B are schematic sectional views that depict additional steps in the method of manufacturing the semiconductor light-emitting device subsequent to the step depicted in FIG. 5C.

DETAILED DESCRIPTION

Figure 1A:
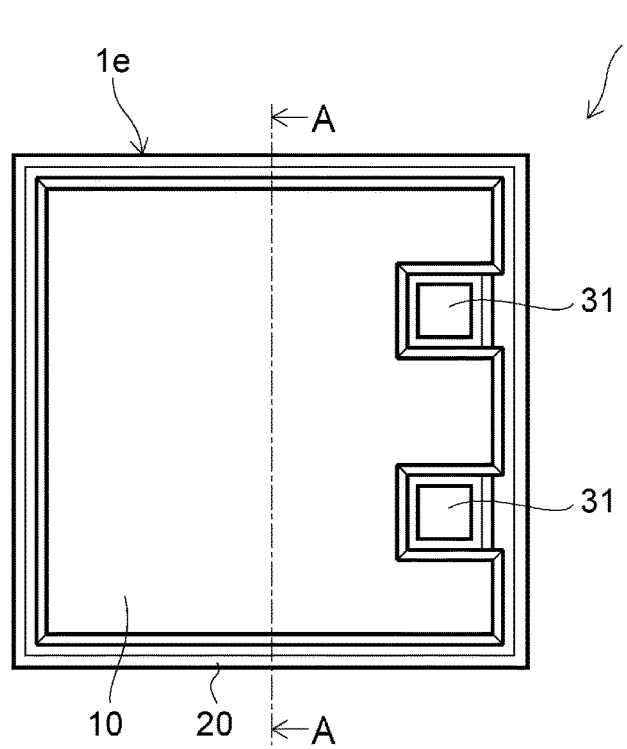
FIG. 1A is a schematic top view showing a semiconductor light-emitting device according to a first embodiment.

Embodiments provide a semiconductor light-emitting device in which light dispersion is increased.

In general, according to one embodiment, there is provided a semiconductor light-emitting device including a light-emitting member that includes a first semiconductor layer of a first conductivity type, a second semiconductor layer of a second conductivity type, and a light-emitting layer between the first semiconductor layer and the second semiconductor layer, a first metal layer electrically connected to the first semiconductor layer, and a second metal layer electrically connected to the second semiconductor layer. The light-emitting member has a first surface including a front surface of the first semiconductor layer, a second surface including a front surface of the second semiconductor layer, a side surface including an outer periphery of the first semiconductor layer, and a recess extending inwardly of the second surface to an interior portion of the first semiconductor layer to expose an inner surface on a side of the recess facing the side surface.

Hereinafter, example embodiments will be described with reference to the drawings. The same elements depicted in different drawings will be assigned the same reference numerals and the repeated detailed description of these elements may be omitted when appropriate, such that differences in elements or other aspects can be described. The drawings are schematic and conceptual, and the depicted relationships between the thickness and width of elements and the ratios of sizes between elements are not necessarily the same as the actual values thereof. Even in a case where the same elements are shown, the dimensions or ratios thereof may be differently shown in the different drawings.

The semiconductor light-emitting devices described in the following embodiments are merely an exemplary, and the scope of the present disclosure is not limited thereto. Furthermore, when the technical features described in the respective semiconductor light-emitting devices are technically applicable, the technical features thereof may be applied in the respective embodiments in common.

First Embodiment

Figure 1B:
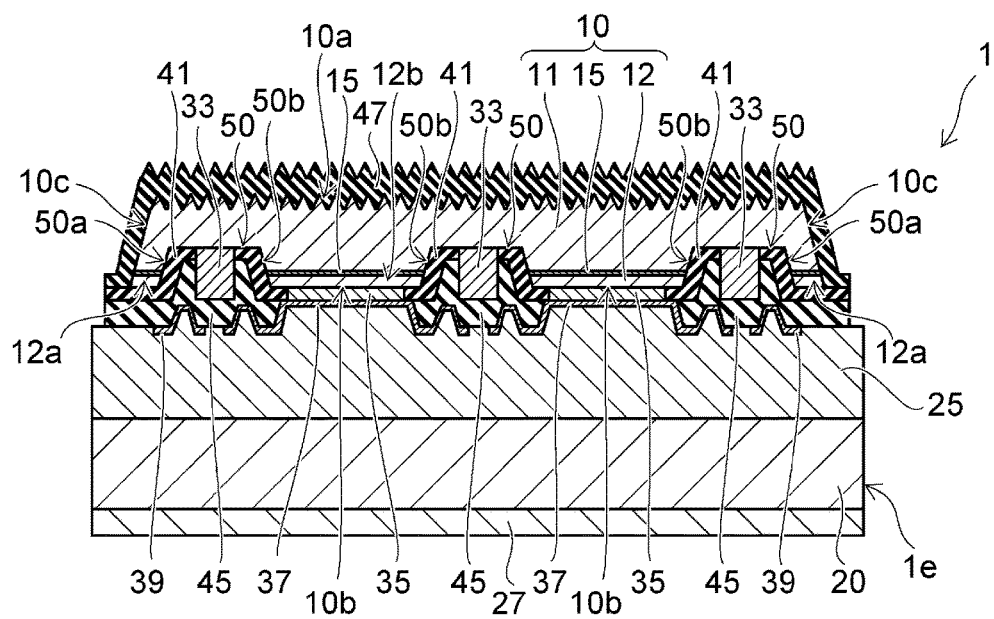
FIG. 1B is a schematic sectional view of the semiconductor light-emitting device.

FIG. 1A is a schematic top view showing a semiconductor light-emitting device 1 according to a first embodiment. FIG. 1B is a schematic sectional view of the semiconductor light-emitting device 1 taken along line A-A shown in FIG. 1A. The semiconductor light-emitting device 1 is a chip-shaped light source, and is mounted on, for example, a mounting substrate.

As shown in FIG. 1A, the semiconductor light-emitting device 1 includes a light-emitting member 10, and a substrate 20. The light-emitting member 10 is provided on the substrate 20. The semiconductor light-emitting device 1 includes bonding pads 31 arranged adjacent to, and partially surrounded by, the light-emitting member 10 on the substrate 20.

As shown in FIG. 1B which is a schematic sectional view of FIG. 1A taken along line A-A, the light-emitting member 10 is attached to the substrate 20 by a bonding layer 25 interposed therebetween. The light-emitting member 10 includes a first semiconductor layer of a first conductivity type (hereinafter, referred to as an n-type semiconductor layer 11 having an n-doped conductivity type), a second semiconductor layer of a second conductivity type (hereinafter, referred to as a p-type semiconductor layer 12 having a p-doped conductivity type), and a light-emitting layer 15 interposed therebetween. The light-emitting member 10 has a structure in which the n-type semiconductor layer 11, the light-emitting layer 15, and the p-type semiconductor layer 12 are sequentially stacked one over the other. Although it will be described in the following description that the first conductivity type is the n-type and the second conductivity type is the p-type, embodiments of the present disclosure are not limited thereto. Exemplary embodiments also include cases where the first conductivity type is the p-type and the second conductivity type is the n-type.

The light-emitting member 10 includes a first surface 10a which includes a front surface of the n-type semiconductor layer 11 which faces away from the bonding layer 25, a second surface 10b which includes a front surface of the p-type semiconductor layer 12 facing the bonding layer 25, and side surfaces 10c which include the outer periphery of the n-type semiconductor layer 11. The light-emitting member 10 includes a recess 50 formed in, and extending inwardly of, the second surface 10b. The recess 50 is formed to a depth from the second surface 10b to extend to the interior portion of the n-type semiconductor layer 11, e.g., a middle portion located approximately half way between first surface 10a and second surface 10b. The recess 50 includes a portion including inner surfaces 50a and 50b, and a portion including two inner surfaces 50b. The inner surface 50a is on the side of the recess 50 that faces the side surface 10c, and extends generally in the direction of, for example, the side surface 10c.

Figure 2A:
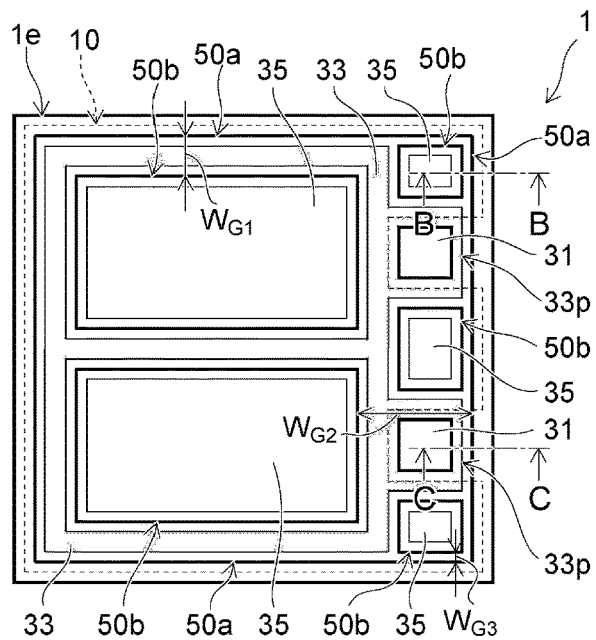
FIG. 2A is another schematic top view showing the semiconductor light-emitting device according to the first embodiment.

Here, the side surface 10c and the inner surface 50a are shown as parallel to each other but they are not required to be parallel in other embodiments. For example, the recess 50 surrounds the p-type semiconductor layer 12 to divide it into a first portion 12a and a second portion 12b as shown in FIG. 2A. The inner surface 50a includes an end surface of the first portion 12a, and the inner surface 50b includes an end surface of the second portion 12b.

Light emitted from the light-emitting layer 15 is primarily irradiated to the outside of the light-emitting member 10 through the first surface 10a. The first surface 10a has a light extraction structure. The light extraction structure controls the total reflection of the emitted light, and improves light extraction efficiency. For example, the first surface 10a is provided with fine protrusions, and is roughened.

The semiconductor light-emitting device 1 includes first metal layers (hereinafter, referred to as n electrodes 33), second metal layers (hereinafter, referred to as p electrodes 35), and third metal layers (hereinafter, referred to as metal layers 37 and 39) disposed on the second surface 10b of the light-emitting member 10. The n electrode 33 is electrically connected to the n-type semiconductor layer 11 at the base of the recess 50 extending inwardly thereof. The p electrode 35 is formed on the second portion 12b of the p-type semiconductor layer 12, and is electrically connected to the p-type semiconductor layer 12. The p electrode 35 is not formed on the first portion 12a of the p-type semiconductor layer 12. The metal layer 37 is formed on the p electrode 35. Preferably, the n electrodes 33, the p electrodes 35 and the metal layers 37 and 39 include a material having a high reflectance to the light emitted by the light-emitting layer 15. The n electrodes 33 include, for example, aluminum (Al). The p electrodes 35 and the metal layers 37 and 39 include, for example, silver (Ag). The metal layers 37 and 39 may not be formed.

The semiconductor light-emitting device 1 includes dielectric films 41, 45 and 47. The dielectric film 41 covers a portion of the inner surface of the recesses 50 where the n electrodes 33 are not formed. The dielectric film 41 covers an outer periphery of the light-emitting layer 15 to protect the outer periphery of the light-emitting layer. The dielectric film 45 covers the entire region of the recesses 50 except the inwardly extending end thereof in contact with n-type semiconductor layer 11. The dielectric film 45 covers the sides and portion of the n electrodes 33 extending from the n-type semiconductor layer, and electrically insulates the n electrodes 33 from the substrate 20 and the bonding layer 25. The dielectric film 45 may be made of the same material as the dielectric film 41.

The dielectric film 47 covers the first surface 10a and the side surfaces 10c of the light-emitting member 10. For example, the dielectric film 47 covers the light-emitting layer 15 exposed to the side surfaces 10c to protect the light-emitting layer. The dielectric film 47 improves adhesion between the light-emitting member 10 and a resin which may be disposed thereover. That is, it is effective in a case where a resin including phosphors is provided on the semiconductor light-emitting device 1.

The metal layer 37 extends on the dielectric film 45, and covers the dielectric films 41 and 45 between the n electrode 33 and the p electrode 35. The metal layer 39 is formed on the dielectric film 45, and covers at least one of the inner surface 50a of the recess 50 and a portion of the second surface 10b between the side surface 10c and the inner surface 50a. The metal layer 37 reflects light which passes through the dielectric films 41 and 45 and propagates toward the substrate 20 and returns the light toward the first surface 10a between the n electrode 33 and the p electrode 35. The metal layer 39 reflects the light which passes through the dielectric films 41 and 45 and propagates toward the substrate 20 and returns the light toward the first surface 10a or the side surface 10c in the outer periphery of the light-emitting member 10. A gap is present between the adjacent ends of the metal layers 37, 39 on dielectric film 45.

The bonding layer 25 is formed so as to cover the metal layers 37 and 39 and portions of the dielectric film 45 not covered by the metal layers 37, 39. The bonding layer 25 is, for example, a conductive layer including a bonding metal made of solder such as gold-tin (AuSn) or nickel-tin (NiSn). The p electrode 35 is electrically connected to the bonding layer 25 by the metal layer 37 interposed therebetween. The bonding layer 25 is electrically connected to the electrically conductive substrate 20 by contact with the substrate 20. The bonding layer 25 includes a high-melting-point metal film such as titanium (Ti), titanium-tungsten (TiW) between the p electrode 35, the metal layers 37 and 39 and the bonding metal. The high-melting-point metal film functions as a barrier film that prevents the solder from spreading to the p electrode 35 and the metal layers 37 and 39. An electrode 27 is formed on a rear surface of the substrate 20. The electrode 27 is, for example, a stacked film of Ti, Pt and Au layers, and has, for example, a film thickness of 800 nm. For example, the electrode 27 is connected to an external circuit with the mounting substrate interposed therebetween. In some embodiments, the mounting substrate may be a conductive material or comprise a conductive material. By contrast, the n electrodes 33 are connected to the external circuit through metal wires, such as gold or aluminum, which are connected to the bonding pads 31.

Figure 2B:
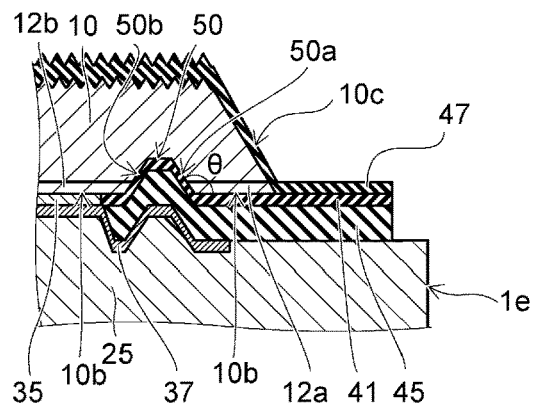
FIGS. 2B and 2C are schematic sectional views of a part of the semiconductor light-emitting device.
Figure 2C:
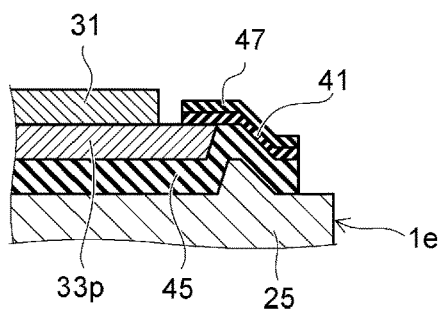

FIG. 2A is another schematic top view showing the semiconductor light-emitting device 1. FIG. 2B is a schematic diagram showing a section taken along line B-B shown in FIG. 2A. FIG. 2C is a schematic diagram showing a section taken along line C-C shown in FIG. 2A.

FIG. 2A is a schematic diagram showing a chip surface on the bottom of the light-emitting member 10. A broken line shown in the drawing indicates the outer periphery (an end of the side surface 10c) of the light-emitting member 10. The n electrode 33 is formed between the inner surfaces 50a and 50b of the recess 50 and between the inner surfaces 50b of the recess 50. The n electrode 33 includes portions (extension portions 33p) that extend to adjacent the side of the light-emitting member 10, and the bonding pads 31 are formed on the extension portions 33p. The p electrode 35 is formed on the second portion 12b of the p-type semiconductor layer 12 and is surrounded by the inner surfaces 50b (see FIG. 1B).

As shown in FIG. 2A, the semiconductor light-emitting device 1 includes five p electrodes 35. The five p electrodes 35 are respectively formed in regions surrounded by the inner surfaces 50b. The portions of the light-emitting member 10 surrounded by the inner surfaces 50b include portions of the light-emitting layer 15, respectively. For example, a drive current of the semiconductor light-emitting device 1 is supplied from the electrode 27 on the rear surface of the substrate 20. The drive current thereof flows from the p electrode 35 to the n electrode 33 with the light-emitting layer 15 interposed therebetween. Accordingly, the semiconductor light-emitting device 1 radiates light from the five portions of the light-emitting layer 15 (emissive regions) surrounded by the inner surfaces 50b. As shown in FIG. 2A, the inner surface 50a is formed so as to surround the five light-emitting regions.

In FIG. 2A, widths $W_{G1}$, $W_{G2}$ and $W_{G3}$ of the recess 50 are shown. The recess 50 has the width $W_{G1}$ extending from the emissive region toward an outer periphery in a portion which surrounds the largest emissive regions. The recess 50 has the width $W_{G2}$ extending from the emissive region toward an outer periphery in a portion where the bonding pads 31 are formed. The n electrode 33 is formed in these portions. For example, the widths $W_{G1}$ and $W_{G2}$ are set based on the desired maximum value of the drive current and the size of the bonding pad. Meanwhile, the recess 50 has the width $W_{G3}$ extending from the emissive region toward an outer periphery in a portion where the n electrode 33 is not formed. For example, the width $W_{G3}$ is set in consideration with processing precision or a processing margin in a semiconductor process. The width $W_{G3}$ is preferably set to be narrower in order to widen the area of the emissive region. A wide p electrode 35 can be formed in a wide emissive region. Thus, the current density of the light-emitting layer 15 is decreased due to the wide p electrode 35, and thus, internal quantum efficiency thereof is improved. More of the light emitted by the light-emitting layer 15 is reflected, and thus, it is possible to improve the light extraction efficiency of the device. Preferably, a minimum width of the recess 50 is in a range of, for example, 0.1 times to 10 times the thickness of the light-emitting member 10 in a stacked direction. More preferably, the minimum width of the recess 50 is in a range of 0.5 times to 2 times of the thickness of the light-emitting member 10 in the stacked direction.

As shown in FIG. 2B, the recess 50 formed in the outer periphery of the light-emitting member 10 divides the p-type semiconductor layer 12 into the first portion 12a and the second portion 12b. The p electrode 35 is formed on the second portion 12b, and is electrically connected to the second portion 12b. The p electrode 35 is not formed on the first portion 12a. That is, the first portion 12a is electrically isolated from the second portion 12b by the recess 50. Accordingly, drive current does not flow to the first portion 12a, and the light-emitting layer 15 in the first portion 12a does not radiate light. Similarly to the second portion 12b, the p electrode 35 may be formed on the first portion 12a. In this case, it is necessary for the dielectric film 47 to passivate the light-emitting layer 15 exposed to the side surface 10c.

The inner surface 50a of the recess 50 is on the side of the recess 50 that faces the side surface 10c of the light-emitting member 10. An internal angle θ of the inner surface 50a measured between the inner surface 50a and the second surface 10b of the light-emitting member 10 is preferably 90 degrees or more.

As shown in FIG. 2C, the extension portions 33p of the n electrode 33 extend toward a chip end 1e on the bonding layer 25 with the dielectric film 45 interposed therebetween. The light-emitting member 10 is not formed on the extension portion 33p, and the bonding pad 31 is formed on the extension portion 33p.

Figure 3A:
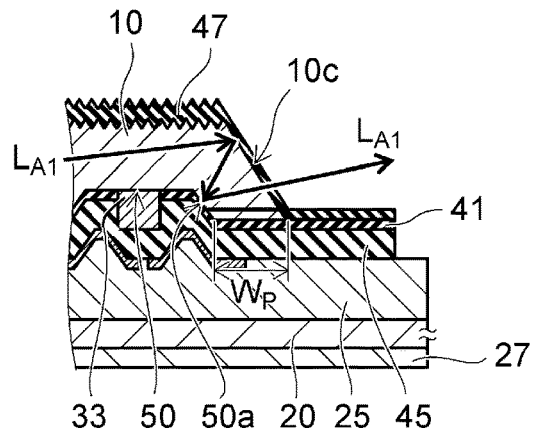
FIGS. 3A to 3C are schematic sectional views of an example of a light propagation path within a light-emitting member.
Figure 3B:
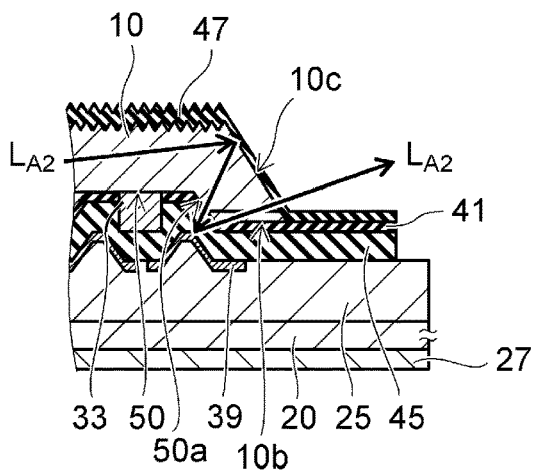
Figure 3C:
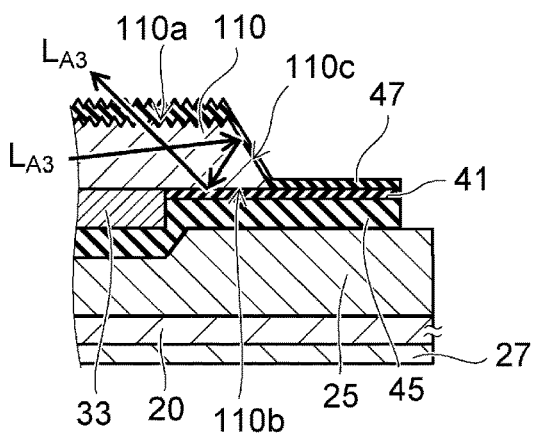

FIGS. 3A to 3C are schematic sectional views of the device showing an example of a propagation path of light that propagates through the inside of the light-emitting member 10. FIGS. 3A and 3B show a section (the end portion of FIG. 1B) of the light-emitting member 10 according to the embodiment. FIG. 3C shows a section of a light-emitting member 110 according to a comparative example.

As shown in FIG. 3A, a portion of the light emitted from the light-emitting layer 15 propagates through the inside of the light-emitting member 10 toward the side surface 10c. For example, when the refractive index of the light-emitting member 10 is greater than the refractive index of the dielectric film 47, light $L_{A1}$ is reflected from the side surface 10c, and propagates toward the inner surface 50a of the recess 50. When the refractive index of the light-emitting member 10 is greater than the refractive index of the dielectric film 41, the light $L_{A1}$ is reflected from the inner surface 50a, and again propagates toward the side surface 10c. As stated above, when light reflection is repeated between the side surface 10c and the inner surface 50a, when the light $L_{A1}$ incident on the side surface 10c is at an angle smaller than a critical angle of the total reflection, it passes through the side surface 10c, and is emitted to the outside.

In the example shown in FIG. 3B, the metal layer 39 is formed between the bonding layer 25 and the dielectric film 45. The metal layer 39 covers at least a portion of the second surface 10b with the dielectric film 45 interposed therebetween, and the inner surface 50a. For example, a portion of the light reflected from the side surface 10c passes through the inner surface 50a, and propagates toward the bonding layer 25. Light travelling along the path $L_{A2}$ is reflected from the metal layer 39, and again propagates toward the side surface 10c. As mentioned above, when light is repeatedly reflected between the side surface 10c and the inner surface 50a or between the side surface 10c and the metal layer 39, when that light $L_{42}$ is incident on the side surface 10c at an angle smaller than a critical angle, it passes through the side surface 10c and is emitted to the outside of the light-emitting device 1. As the dielectric film 45 becomes thinner, the light $L_{42}$ which propagates through the inside of the dielectric film 45 and arrives at the bonding layer 25 is more and more reduced, and thus, it is possible to improve the light extraction efficiency of the device 1. As the dielectric film 45 becomes thicker, the insulation properties between the n electrode 33 and the bonding layer 25 become better, and thus, it is possible to improve reliability. Preferably, a thickness of the dielectric film 45 is in a range of, for example, 0.1 μm to 3 μm. More preferably, the thickness of the dielectric film is in a range of 0.5 μm to 2 μm.

Unlike these examples, the light-emitting member 110 shown in FIG. 3C does not have the recess 50 in the outer periphery thereof. Light $L_{43}$ which propagates through the inside of the light-emitting member 110 toward a side surface 110c is reflected from the side surface 110c, and propagates toward the second surface 110b. The light $L_{43}$ which propagates toward the second surface 110b is reflected from the second surface 110b, and propagates toward the first surface 110a. Thereafter, the light $L_{43}$ is repeatedly reflected in the light-emitting member 110, and is emitted to the outside of the light-emitting member 110 when the light is incident on the first surface 110a at an angle smaller than a critical angle. For example, when the first surface 110a has the light extraction structure, the total reflection on the first surface 110a is controlled, and the light $L_{43}$ is emitted to the outside without being repeatedly reflected within the light-emitting member 110.

As discussed above, the recess 50 formed in the light-emitting member 10 increases the light radiation from the side surface 10c. Thus, since it is possible to widen the area of light dispersion of the semiconductor light-emitting device 1, it is possible to reduce light concentration toward the first surface 10a from the light-emitting layer 15, and it is possible to improve light dispersion characteristics of the device 1.

In FIGS. 3A and 3B, the side surface 10c of the light-emitting member 10 is inclined such that the second surface 10b extends closer to the periphery of the light-emitting device 1 than does first surface 10a. Such a side surface 10c is a surface that is easily formed when the semiconductor layers 11, 12 and light-emitting layer 15 are selectively etched. Most dielectric films used for manufacturing a semiconductor have a refractive index smaller a refractive index of the semiconductor. That is, advantageous effects of the recess 50 formed in the outer periphery of the light-emitting member 10 can be realized in many semiconductor light-emitting devices.

Preferably, a gap $W_P$ between the inner surface 50a and the side surface 10c at second surface 10b extending from the emissive region toward the chip end 1e is in a range of, for example, 0.2 times to 10 times of the thickness of the light-emitting member 10 in the stacked direction. More preferably, the gap $W_P$ is in a range of 0.5 times to 2 times of the thickness of the light-emitting member 10 in the stacked direction. For example, it is preferable that the gap $W_P$ is set in the aforementioned range due to the limitations such as a method of processing the side surface 10c and the recess 50 or a design of light dispersion characteristics. Thus, most light which propagates toward the side surface 10c can be reflected from the inner surface 50a, and can be emitted from the side surface 10c.

Next, a method of manufacturing the semiconductor light-emitting device 1 will be described with reference to FIGS. 4A to 8B. FIGS. 4A to 8B are schematic sectional views which sequentially show the results of manufacturing steps during the manufacturing of the semiconductor light-emitting device 1.

Figure 4A:
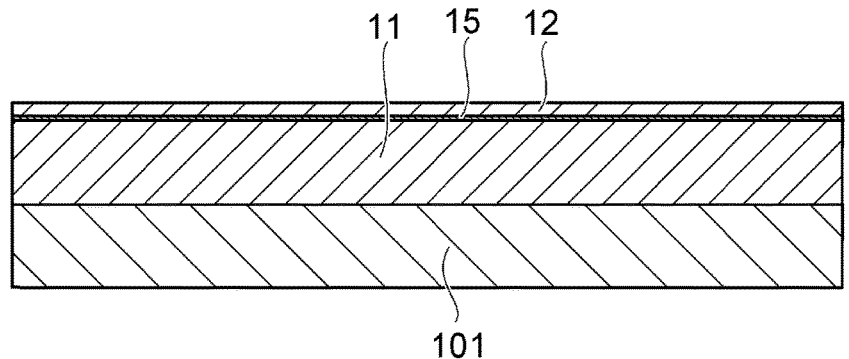
FIGS. 4A to 4C are schematic sectional views that depict steps in the method of manufacturing the semiconductor light-emitting device according to the first embodiment.

As shown in FIG. 4A, the n-type semiconductor layer 11, the light-emitting layer 15 and the p-type semiconductor layer 12 are sequentially formed and thus stacked on the substrate 101. In the present specifications, the stacked state includes a state in which another element or layer is interposed between the layers in addition to a state in which the layers are directly in contact with each other.

A substrate 101 includes, for example, aluminum or silicon. The n-type semiconductor layer 11, the p-type semiconductor layer 12 and the light-emitting layer 15 include nitride semiconductors, respectively. The n-type semiconductor layer 11, the p-type semiconductor layer 12 and the light-emitting layer 15 include, for example, $Al_xGa_{1-x-y}In_yN$ (x≥0, y≥0, x+y≤1).

The n-type semiconductor layer 11 includes, for example, a Si-doped n-type GaN contact layer, and a Si-doped n-type AlGaN cladding layer. The Si-doped n-type AlGaN cladding layer is arranged between the Si-doped n-type GaN contact layer and the light-emitting layer 15. The n-type semiconductor layer 11 may further include a buffer layer, and the Si-doped n-type GaN contact layer is arranged between the GaN buffer layer and the Si-doped n-type AlGaN cladding layer. For example, any one of AlN, AlGaN, and GaN or a combination thereof is used as the buffer layer.

For example, the light-emitting layer 15 has a multiple quantum well (MQW) structure. For example, a plurality of barrier layers and a plurality of well layers are alternately stacked in the MQW structure. For example, AlGaInN is used as the well layer. For example, GaInN is used as the well layer.

For example, Si-doped n-type AlGaN is used as the barrier layer. For example, Si-doped n-type $Al_{0.1}Ga_{0.9}N$ is used as the barrier layer. For example, a thickness of the barrier layer is in a range of 2 nm to 30 nm. Among the plurality of barrier layers, the barrier layer (a p-side barrier layer) closest to the p-type semiconductor layer 12 may be different from another barrier layer, or may be thicker or thinner than another barrier layer.

A wavelength (a peak wavelength) of the light (the emitted light) emitted from the light-emitting layer 15 is in a range of 210 nm to 700 nm. For example, the peak wavelength of the emitted light may be in a range of 370 nm to 480 nm.

The p-type semiconductor layer 12 includes, for example, a non-doped AlGaN spacer layer, a Mg-doped p-type AlGaN cladding layer, a Mg-doped p-type GaN contact layer, and a high-concentration Mg-doped p-type GaN contact layer. The Mg-doped p-type GaN contact layer is arranged between the high-concentration Mg-doped p-type GaN contact layer and the light-emitting layer 15. The Mg-doped p-type AlGaN cladding layer is arranged between the Mg-doped p-type GaN contact layer and the light-emitting layer 15. The non-doped AlGaN spacer layer is arranged between the Mg-doped p-type AlGaN cladding layer and the light-emitting layer 15. For example, the p-type semiconductor layer 12 includes a non-doped $Al_{0.11}Ga_{0.89}N$ spacer layer, a Mg-doped p-type $Al_{0.28}Ga_{0.72}N$ cladding layer, a Mg-doped p-type GaN contact layer, and a high-concentration Mg-doped p-type GaN contact layer.

In the aforementioned semiconductor layers, the composition, composition ratio, kind of impurities (dopants), concentration of impurities (dopants) and thickness are merely examples, and various modifications thereof are possible.

Figure 4B:
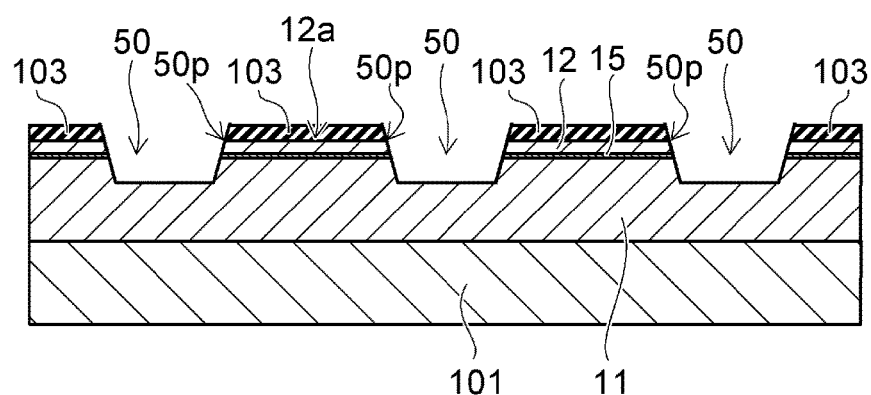

As shown in FIG. 4B, the recesses 50 are formed. For example, the recesses may be formed by selectively etching through a portion of the p-type semiconductor layer 12 and, a portion of the light-emitting layer 15, and then etching into portions of the n-type semiconductor layer 11 all through openings formed in a hard mask 103. The hard mask 103 is, for example, a silicon oxide film. An etching depth is in a range of, for example, 0.1 μm to 100 μm. Preferably, the etching depth is in a range of 0.4 μm to 2 μm. The etching depth is set depending on the width of the recesses 50 across the inner surfaces 50a of the recess 50 in a depth direction. The recess 50 is formed at a depth at which the bottom thereof is positioned in the interior portion of the n-type semiconductor layer 11. As the etching depth becomes deeper, the amount of light reflected from the inner surface 50a becomes greater. Thus, it is possible to further widen the light dispersion of the semiconductor light-emitting device 1.

The recess 50 includes an opening 50p on the front surface of the p-type semiconductor layer 12. Preferably, the minimum width (at the front surface) of the opening 50p is in a range of, for example, 0.1 times to 100 times of the total thickness of the n-type semiconductor layer 11, the light-emitting layer 15 and the p-type semiconductor layer 12. More preferably, the minimum width of the opening 50p is in a range of 0.5 times to 20 times of the total thickness of the n-type semiconductor layer 11, the light-emitting layer 15 and the p-type semiconductor layer 12.

Figure 4C:
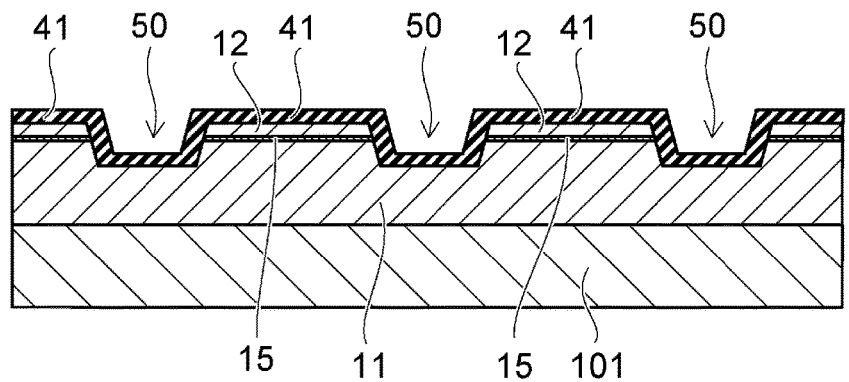

As shown in FIG. 4C, the dielectric film 41 that covers a top surface of the p-type semiconductor layer 12 and inner surfaces of the recesses 50 is next formed. The dielectric film 41 is, for example, a silicon oxide film or a silicon nitride film. The hard mask 103 is removed by etching thereof before the dielectric film 41 is formed.

Figure 5A:
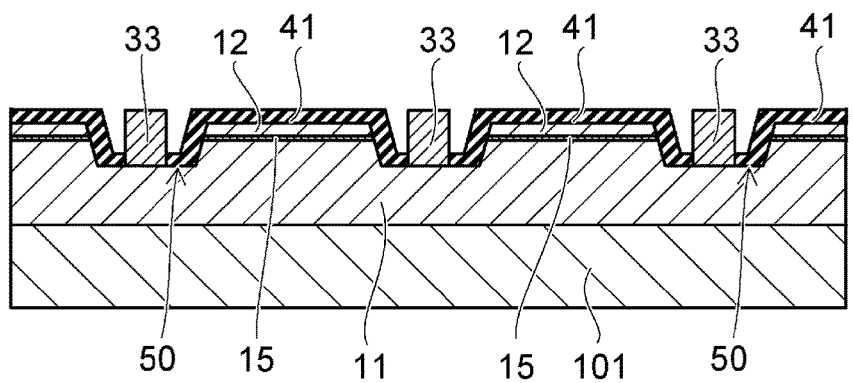
FIGS. 5A to 5C are schematic sectional views that depict additional steps in the method of manufacturing the semiconductor light-emitting device subsequent to the step depicted in FIG. 4C.

As shown in FIG. 5A, the portion of the dielectric film 41 formed on bottom surfaces of the recesses 50 is selectively removed, and the n-type semiconductor layer 11 is exposed therethrough. Subsequently, as depicted in FIG. 5A, n electrodes 33, which are electrically connected to the n-type semiconductor layer 11, are formed. A material of the n electrode 33 has both an ohmic contact to the n-type semiconductor layer 11 and a high light reflectance, and includes at least one of aluminum (Al) and silver (Ag).

Figure 5B:
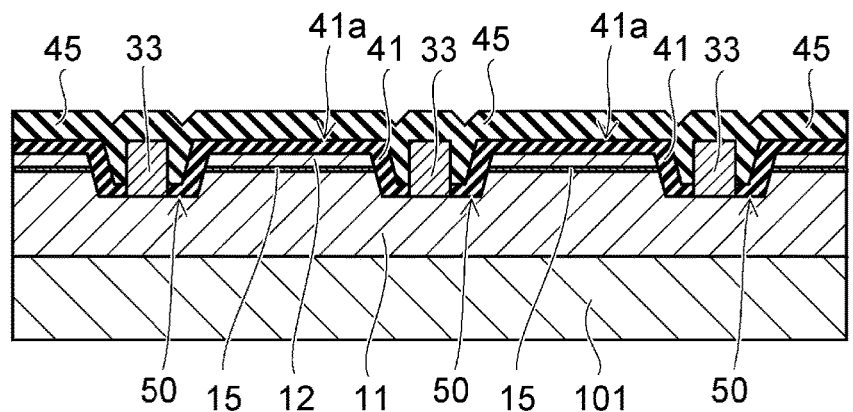

As shown in FIG. 5B, the dielectric film 45 that covers both the dielectric film 41 and the n electrodes 33 are formed. The dielectric film 45 is, for example, a silicon oxide film.

Figure 5C:
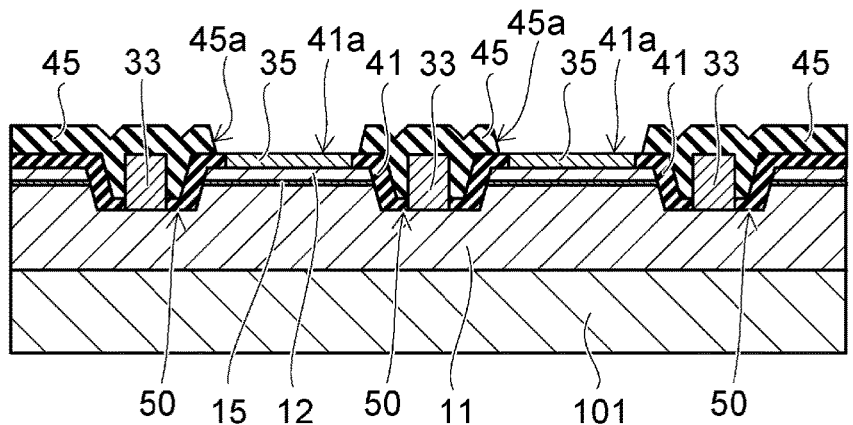

As shown in FIG. 5C, the dielectric films 45 and 41 are selectively etched, and openings 45a and 41a therethrough are formed. Thus, the p-type semiconductor layer 12 is exposed in the openings. In this stage, the portions of the dielectric film 41 that covers the inner surface from which the portions where the n electrodes 33 are formed are removed, and the dielectric film 45 that covers the n electrodes 33 and the dielectric film 41 is left in the recesses 50. Thereafter, the p electrodes 35 that are electrically connected to the p-type semiconductor layer 12 are formed in the openings in the dielectric film 41. The p electrode 35 includes, for example, Ag.

As shown in FIG. 6A, the metal layers 37 and 39 are next formed. The metal layer 37 is formed on the p electrode 35 and extends therefrom on the dielectric film 45 to overlies the inner surfaces 50b of the recesses 50 with the dielectric films 41 and 45 interposed therebetween. The metal layer 39 is formed on the dielectric film 45, and overlies the inner surfaces 50a of the recesses 50 with the dielectric films 41 and 45. The metal layers 37 and 39 include, for example, Ag.

As shown in FIG. 6A, a bonding layer 25a that covers the metal layers 37 and 39 and the exposed portions of the dielectric film 45 between the ends of the metal layers 37 and 39 are formed. For example, the bonding layer 25a includes a metal film including at least any one of Ti, Pt and Ni, and a bonding metal. For example, the bonding metal includes at least any one of a Ni—Sn alloy, an Au—Sn alloy, a Bi—Sn (bismuth-tin) alloy, a Sn—Cu (tin-copper) alloy, a Sn—In (tin-indium) alloy, a Sn—Ag (tin-silver) alloy, a Sn—Pb (tin-lead) alloy, a Pb—Sn—Sb (lead-tin-antimony) alloy, a Sn—Sb (tin-antimony) alloy, a Sn—Pb—Bi (tin-lead-bismuth) alloy, a Sn—Pb—Cu (tin-lead-copper) alloy, a Sn—Pb—Ag (tin-lead-silver) alloy, and a Pb—Ag (lead-silver) alloy. The metal film including at least any one of Ti, Pt and Ni is formed between the bonding metal and the metal layer 37, between the bonding metal and the metal layer 39, and between the bonding metal and the exposed portions of the dielectric film 45.

As shown in FIG. 6B, the substrate 101 on which the bonding layer 25a is formed and the substrate 20 are positioned to face each other. A bonding layer 25b is formed on the top surface of the substrate 20. The bonding layer 25b of the substrate 20 is arranged so as to face the bonding layer 25a of the substrate 101.

For example, the bonding layer 25b includes a metal film including at least any one of Ti, Pt and Ni, and a bonding metal. For example, the bonding metal includes at least any one of a Ni—Sn alloy, an Au—Sn alloy, a Bi—Sn alloy, a Sn—Cu alloy, a Sn—In alloy, a Sn—Ag alloy, a Sn—Pb alloy, a Pb—Sn—Sb alloy, a Sn—Sb alloy, a Sn—Pb—Bi alloy, a Sn—Pb—Cu alloy, a Sn—Pb—Ag alloy, and a Pb—Ag alloy. The metal film including at least any one of Ti, Pt and Ni is formed between the bonding metal and the substrate 20.

Figure 7A:
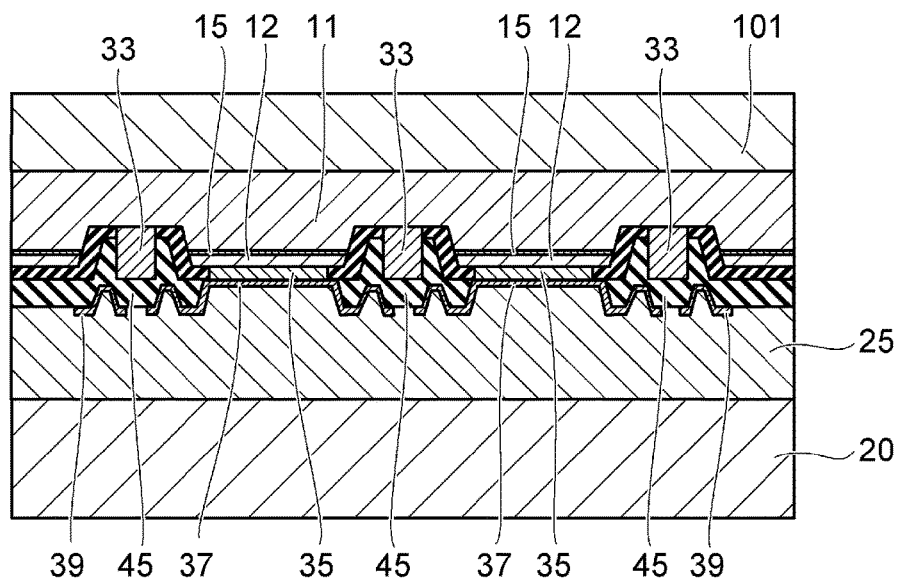
FIGS. 7A and 7B are schematic sectional views that depict additional steps in the method of manufacturing the semiconductor light-emitting device subsequent to the step depicted in FIG. 6B.

As shown in FIG. 7A, the bonding layers 25a and 25b come in contact with each other, and the substrate 101 and the substrate 20 are heated and pressed together. Thus, the bonding layers 25a and 25b are integrated into a single layer, and the bonding layer 25 is obtained. FIG. 7A shows a state in which the configuration of FIG. 6B is now flipped and the respective semiconductor layers and the substrate 101 are arranged on the substrate 20 with the bonding layer 25 interposed therebetween.

Figure 7B:
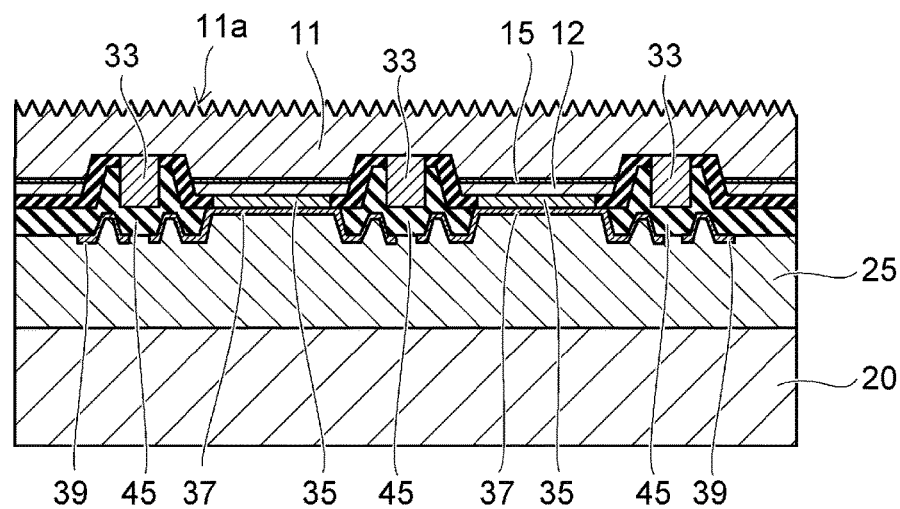

As shown in FIG. 7B, the substrate 101 has been removed. For example, when the substrate 101 is a silicon substrate, the substrate is removed using a method such as grinding or dry etching (for example, RIE (Reactive Ion Etching)). For example, when the substrate 101 is a sapphire substrate, the substrate is removed using LLO (Laser Lift Off). A front surface 11a of the n-type semiconductor layer 11 is then provided with fine protrusions, that is, in this example the front surface 11a is roughened (made to be optically unsmooth). For example, the front surface 11a of the n-type semiconductor layer 11 is roughened using RIE or a wet process using an alkali etchant.

Figure 8A:
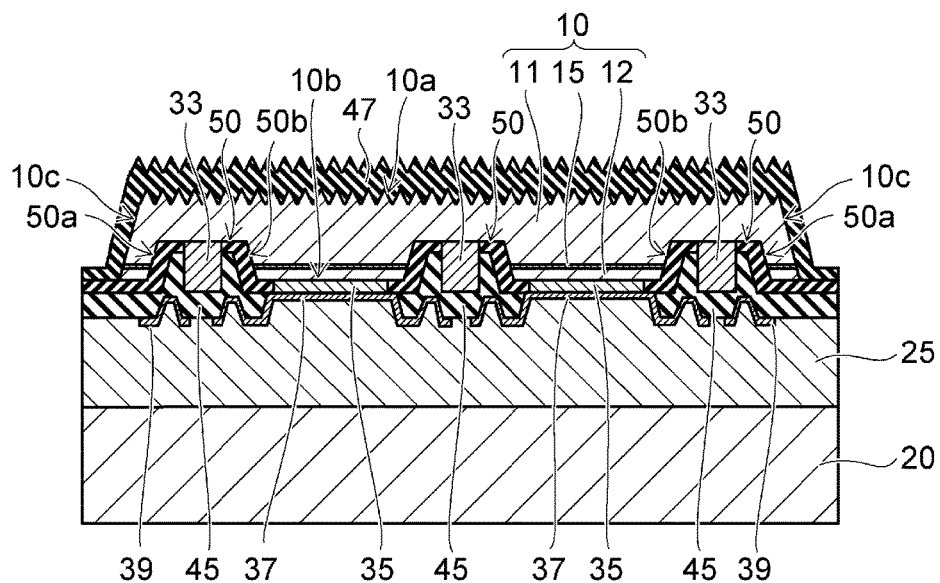
FIGS. 8A and 8B are schematic sectional views that depict additional steps in the method of manufacturing the semiconductor light-emitting device subsequent to the step depicted in FIG. 7B.

As shown in FIG. 8A, the n-type semiconductor layer 11, the p-type semiconductor layer 12 and the light-emitting layer 15 are selectively removed around the periphery, and the light-emitting member 10 is thus formed. For example, the n-type semiconductor layer 11, the light-emitting layer 15 and the p-type semiconductor layer 12 are sequentially etched adjacent the periphery using a method such as RIE or wet etching. In this case, the n electrodes 33 at the bonding pads are then exposed (see FIG. 2A).

For example, the n electrodes are formed by performing CVD (Chemical Vapor Deposition) on the silicon oxide film which becomes the dielectric film 47. For example, a thickness of the silicon oxide film is approximately 200 nm (preferably, in a range of 50 nm to 400 nm). The bonding pads 31 are formed by removing the dielectric film 47 on the n electrodes 33 in the regions where the bonding pads 31 are formed.

Figure 8B:
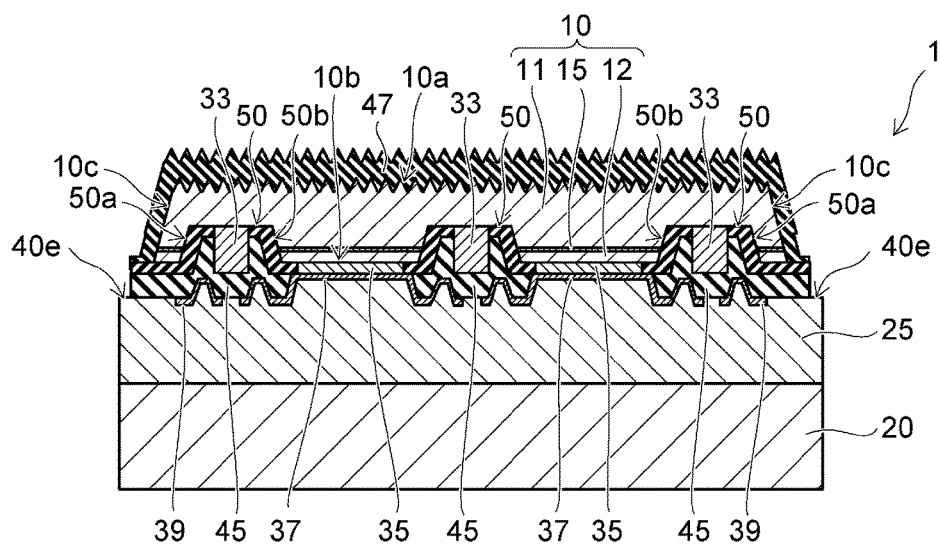

As shown in FIG. 8B, the dielectric films 47, 41 and 45 on the periphery of the light-emitting member 10 are selectively removed (set back from the edge), and a dicing region 40e is formed. Subsequently, the bonding layer 25 and the substrate 20 are cut through using, for example, a dicer or a scriber, to form individual devices, and the semiconductor light-emitting device 1 is thus manufactured as a singulated chip.

In the aforementioned example, the refractive index of the silicon oxide film used as the dielectric films 41, 45 and 47 is approximately 1.47 (a wavelength of 450 nm), and the refractive index of GaN used as the n-type semiconductor layer 11 and the p-type semiconductor layer 12 is approximately 2.5 (a wavelength of 450 nm). Accordingly, light which is incident on an interface between the n-type semiconductor layer 11 and the dielectric film 41 and an interface between the n-type semiconductor layer 11 and the dielectric film 47 from the n-type semiconductor layer 11 at an incident angle greater than a critical angle is totally reflected. That is, most light which propagates through the inside of the light-emitting member 10 toward the side surface 10c is reflected from the side surface 10c (the interface between the n-type semiconductor layer 11 and the dielectric film 47). At least a portion of the light reflected from the side surface 10c is reflected from the inner surface 50a of the recess 50 (the interface between the n-type semiconductor layer or the p-type semiconductor layer and the dielectric film 41). The light which passes through the inner surface 50a and propagates toward the bonding layer 25 is reflected from the metal layer 39, and is returned to the light-emitting member 10. As a result, light may be repeatedly reflected between the side surface 10c and the inner surface 50a. That light incident on the side surface 10c at an angle less than the critical angle is emitted to the outside from the side surface 10c. Thus, the light emitted from the side surface 10c of the light-emitting member 10 is increased, and thus, it is possible to widen the area of light dispersion of the semiconductor light-emitting device 1.

In addition to the silicon oxide film, silicon nitride or silicon oxynitride may be used as the dielectric films 41, 45 and 47. Alternatively, metal oxide using at least any one of Al (aluminum), Zr (zirconium), Ti (titanium), Nb (niobium) and Hf (hafnium), metal nitride using at least any one thereof, or metal oxynitride using at least any one thereof may be used.

Second Embodiment

Figure 9A:
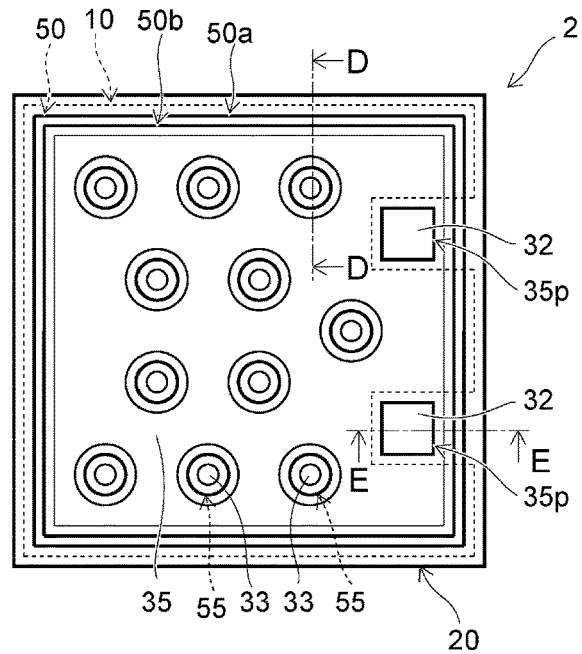
FIG. 9A is a schematic top view showing a semiconductor light-emitting device according to a second embodiment.
Figure 9B:
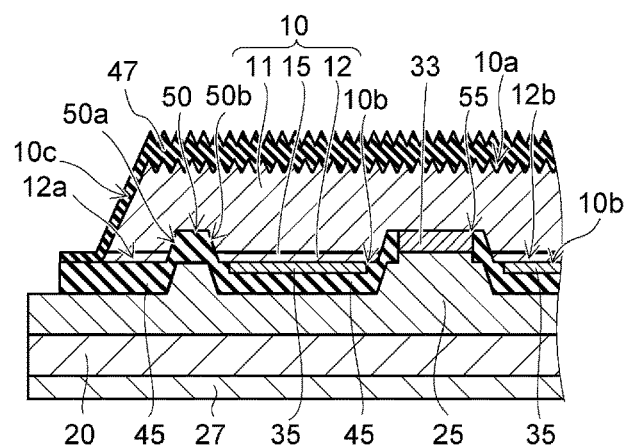
FIGS. 9B and 9C are schematic sectional views of a major part of the semiconductor light-emitting device.
Figure 9C:
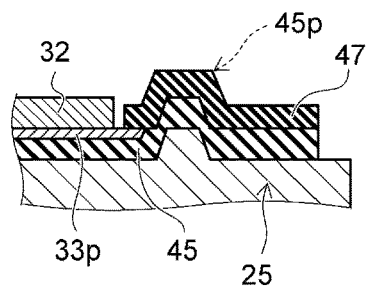

FIG. 9A is a schematic top view showing a semiconductor light-emitting device 2 according to a second embodiment. FIGS. 9B and 9C are schematic sectional views of a major part of the semiconductor light-emitting device 2. FIG. 9B shows a section taken along line D-D shown in FIG. 9A, and FIG. 9C shows a section taken along line E-E shown in FIG. 9A.

The semiconductor light-emitting device 2 includes a light-emitting member 10, and a substrate 20. The light-emitting member 10 is provided on the substrate 20. FIG. 9A is a top view showing an electrode surface on the bottom of the light-emitting member 10. A broken line of FIG. 9A indicates an outer periphery of the light-emitting member 10.

As shown in FIG. 9A, the semiconductor light-emitting device 2 includes n electrodes 33 and p electrodes 35 formed on the bottom of the light-emitting member 10. In the present embodiment, the p electrode 35 includes a portion (an extension portion 35p) that extends to a location adjacent to a side of the light-emitting member 10, and a bonding pad 32 is formed on the extension portion 35p.

The light-emitting member 10 includes a recess 50 that extends along an outer periphery of the p electrode 35. The recess 50 includes inner surfaces 50a and 50b. The inner surface 50a extends along the outer periphery of the light-emitting member 10. The inner surface 50b extends along the outer periphery of the p electrode 35.

The light-emitting member 10 includes a plurality of recesses 55 extending thereinto. The recesses 55 are spaced from the p electrode 35 so that they are isolated from the p electrode 35. The n electrodes 33 are respectively formed in the recesses 55.

As shown in FIG. 9B, the light-emitting member 10 is provided on the substrate 20 with a bonding layer 25 interposed therebetween. The light-emitting member 10 includes an n-type semiconductor layer 11, a p-type semiconductor layer 12, and a light-emitting layer 15. The light-emitting layer 15 is formed between the n-type semiconductor layer 11 and the p-type semiconductor layer 12. The light-emitting member 10 includes a first surface 10a including a front surface of the n-type semiconductor layer 11, a second surface 10b including a front surface of the p-type semiconductor layer 12, and a side surface 10c including an outer periphery of the n-type semiconductor layer 11. Preferably, the first surface 10a has a light extraction structure. A dielectric film 47 covers the first surface 10a and the side surfaces 10c. The recess 50 and the recesses 55 are formed in the second surface 10b. The inner surface 50a of the recess 50 is on the side of the recess 50 that faces the side surface 10c of the light-emitting member 10.

The n electrodes 33 and the p electrodes 35 are formed between the light-emitting member 10 and the bonding layer 25. A dielectric film 45 is formed between the p electrodes 35 and the bonding layer 25. The dielectric film 45 covers the inner surfaces of the recess 50 and the front surface of the p-type semiconductor layer 12. The n electrodes 33 are respectively formed on bottom surfaces of the recesses 55, and are electrically connected to the n-type semiconductor layer 11. The bonding layer 25 extends in the recesses 55, and is in contact with the n electrodes 33. That is, the n electrodes 33 are electrically connected to the substrate 20 with the bonding layer 25 interposed therebetween. The p electrodes 35 are formed between the p-type semiconductor layer 12 and the dielectric film 45, and are electrically connected to the p-type semiconductor layer 12. The p electrodes 35 are electrically insulated from the bonding layer 25 and the substrate 20 by the dielectric film 45.

As shown in FIG. 9C, the extension portion 33p of the p electrode 33 extends over the bonding layer 25 with the dielectric film 45 interposed therebetween. The bonding pad 32 is formed on the extension portion 33p. For example, the p electrodes 33 are electrically connected to an external circuit through metal wires connected to the bonding pads 32. The dielectric film 45 includes a protrusion 45p outside the extension portion 35p. The protrusion 45p is a portion formed in the recess 50, and is exposed after the n-type semiconductor layer 11, the light-emitting layer 15 and the p-type semiconductor layer 12 are selectively removed.

The recess 50 forms the inner surface 50a facing the side surface 10c of the light-emitting member 10. The inner surface 50a reflects the light which is reflected from the side surface 10c and propagates it back toward the side surface 10c. Thus, the light emitted from the side surface 10c is increased, and thus, it is possible to widen the area of light dispersion of the semiconductor light-emitting device 2.

The p-type semiconductor layer 12 includes a first portion 12a between the side surface 10c and the inner surface 50a, and a second portion 12b that is electrically connected to the p electrodes 35. The first portion 12a is formed along the outer periphery of the light-emitting member 10. The first portion 12a is electrically insulated from the bonding layer 25 and the substrate 20 by the dielectric film 45. Accordingly, drive current does not flow to the first portion 12a, and the light-emitting layer 15 between the first portion 12a and the n-type semiconductor layer 11 does not radiate light.

Third Embodiment

Figure 10A:
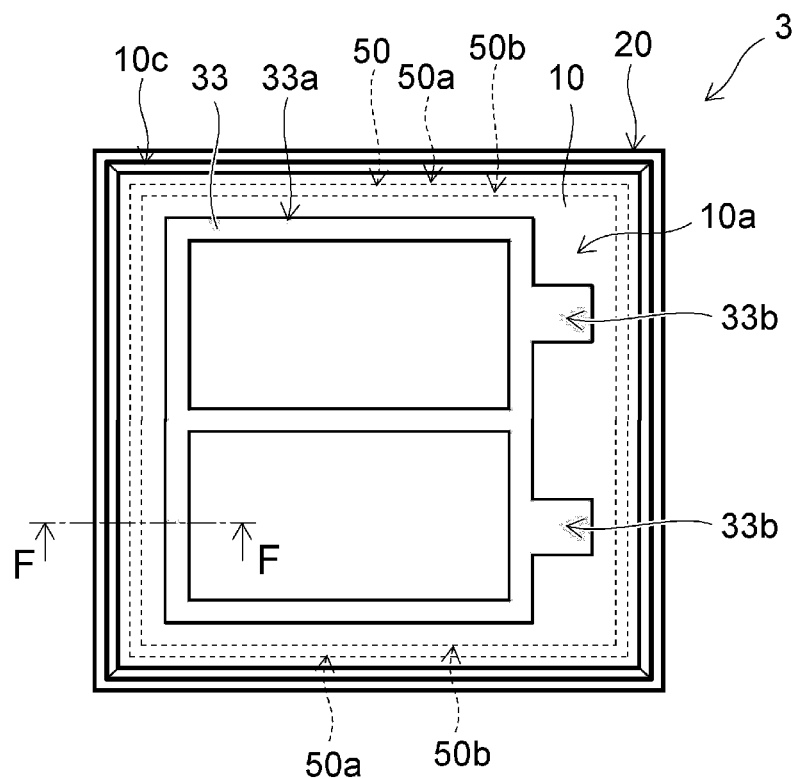
FIG. 10A is a schematic top view showing a semiconductor light-emitting device according to a third embodiment.
Figure 10B:
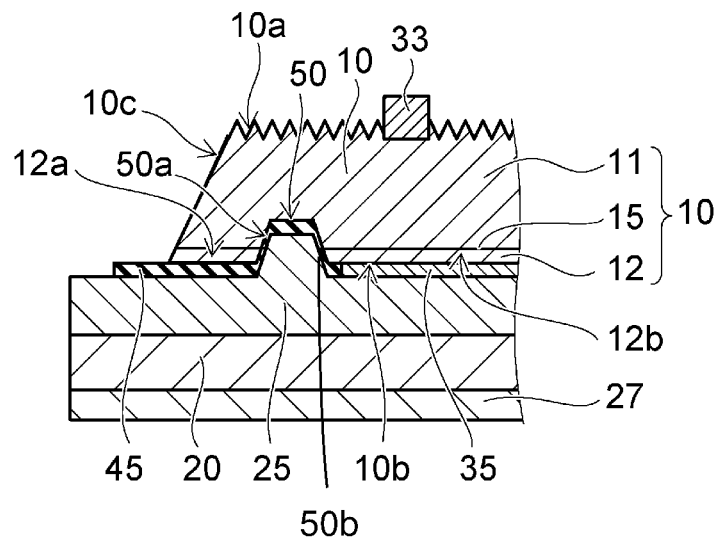
FIG. 10B is a schematic sectional view of a major part of the semiconductor light-emitting device.

FIG. 10A is a schematic top view showing a semiconductor light-emitting device 3 according to a third embodiment, and FIG. 10B is a section of a portion of the light-emitting device taken along line F-F shown in FIG. 10A.

The semiconductor light-emitting device 3 includes a light-emitting member 10, and a substrate 20. The light-emitting member 10 is provided on the substrate 20. As shown in FIG. 10A, the semiconductor light-emitting device 3 in this third embodiment includes the n electrode 33 located on the exterior surface side of the light-emitting member 10, that is, here n electrode 33 is not in the recess 50 like it was in the first two embodiments. The n electrode 33 includes a portion 33a that surrounds the opening through which light is emitted, and generally bisects that opening, and integral bonding pads 33b formed as extensions thereof extending toward the side of the device 3. The light-emitting member 10 includes a recess 50 extending inwardly thereof at the side opposite to where the n electrode is located, and the recess extending around, at a location slightly inwardly of, the outer periphery thereof. The recess 50 includes inner surfaces 50a and 50b. The inner surface 50a extends along the side surface 10c in the outer periphery of the light-emitting member 10.

As shown in FIG. 10B, the light-emitting member 10 is provided on the substrate 20 with a bonding layer 25 interposed therebetween. The light-emitting member 10 includes an n-type semiconductor layer 11, a p-type semiconductor layer 12, and a light-emitting layer 15. The light-emitting layer 15 is formed between the n-type semiconductor layer 11 and the p-type semiconductor layer 12. The light-emitting member 10 includes a first surface 10a including a front surface of the n-type semiconductor layer 11, a second surface 10b including a front surface of the p-type semiconductor layer 12, and a side surface 10c including an outer periphery of the n-type semiconductor layer 11. Preferably, the portion of the first surface 10a where the n electrode 33 is not formed has a light extraction structure. The recess 50 is formed in the second surface 10b. The inner surface 50a of the recess 50 is on the side of the recess 50 that faces the side surface 10c of the light-emitting member 10.

The p-type semiconductor layer 12 includes a first portion 12a between the side surface 10c and the recess 50, and a second portion 12b surrounded by the recess 50. A p electrode 35 is formed between the second portion 12b and the bonding layer 25. The p electrode 35 is electrically connected to the second portion 12b. The p electrode 35 is electrically connected to the substrate 20 with the bonding layer 25 interposed therebetween. Meanwhile, a dielectric film 45 is formed between the first portion 12a and the bonding layer 25. The dielectric film 45 covers the inner surfaces of the recess 50. The first portion 12a of the p-type semiconductor layer 12 is electrically insulated from the bonding layer 25 and the substrate 20 by the dielectric film 45.

The recess 50 according to the present embodiment is formed to have the inner surface 50a on a side thereof facing the side surface 10c of the light-emitting member 10. The inner surface 50a reflects light which is reflected from the side surface 10c and propagates toward the bonding layer 25, and returns the light toward the side surface 10c. Thus, the light is emitted from the side surface 10c, and thus, it is possible to widen the light dispersion of the semiconductor light-emitting device 3.

The first portion 12a of the p-type semiconductor layer 12 is formed along an outer periphery of the light-emitting member 10. The first portion 12a is electrically insulated from the bonding layer 25 and the substrate 20 by the dielectric film 45. For this reason, drive current does not flow to the first portion 12a, and the light-emitting layer 15 between the first portion 12a and the n-type semiconductor layer 11 does not radiate light. In other words, an electric field is not generated in the light-emitting layer 15 exposed to the side surface 10c of the light-emitting member 10. Accordingly, it is possible to omit the dielectric film 47 that protects an end of the light-emitting layer 15.

Figure 11A:
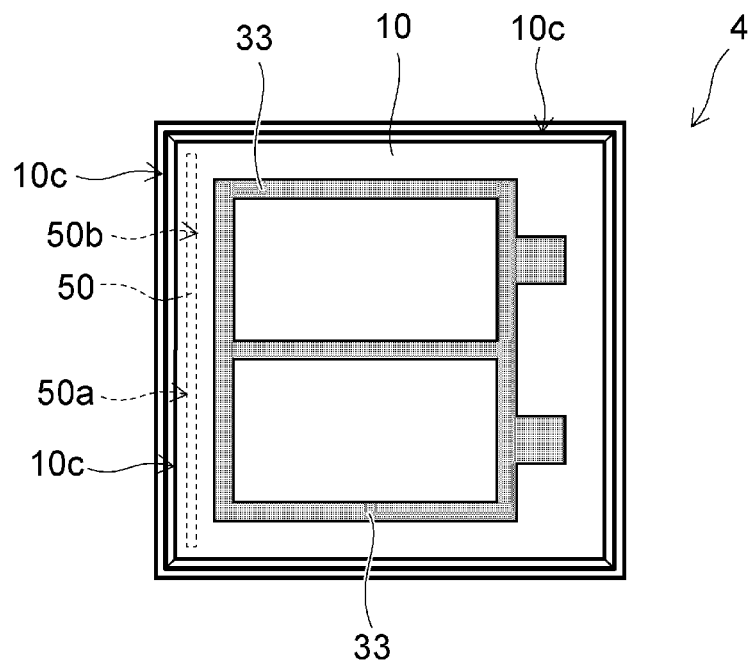
FIGS. 11A and 11B are schematic sectional views showing semiconductor light-emitting devices according to modification examples of the third embodiment.
Figure 11B:
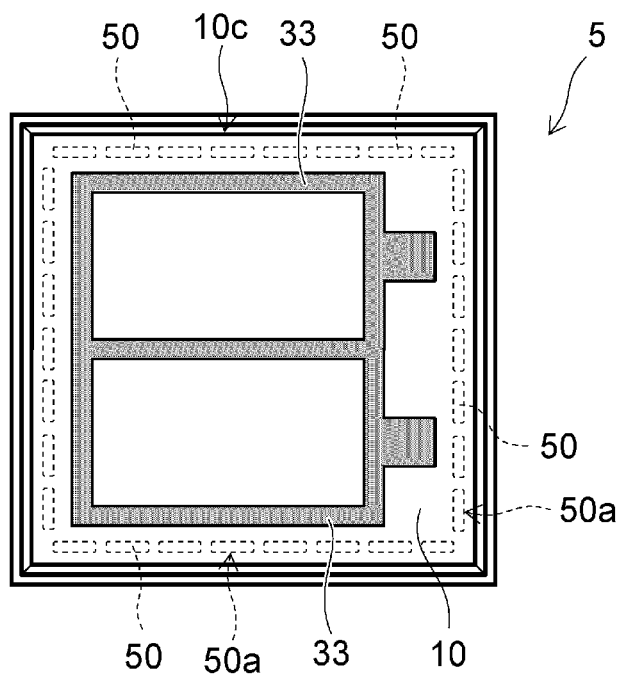

FIGS. 11A and 11B are schematic top vies showing semiconductor light-emitting devices 4 and 5 according to modification examples of the third embodiment. As shown in the drawing, the semiconductor light-emitting devices 4 and 5 are different from the semiconductor light-emitting device 3 in view of the arrangement of the recess 50.

As shown in FIG. 11A, a recess 50 extends along one side of a light-emitting member 10. An inner surface 50a of the recess 50 is thus formed only along one side surface 10c of the light-emitting member 10. Thus, it is possible to increase the amount of light emitted from the side surface 10c facing the inner surface 50a. In other words, the recess 50 is formed along the side surface 10c in which light dispersion is widened in the semiconductor light-emitting device 4. The recess 50 is not limited to be arranged along one side surface 10c, but may be arranged along two or three side surfaces 10c.

As shown in FIG. 11B, a plurality of recesses 50 may be formed along an outer periphery of the light-emitting member 10. Each recess 50 is formed in an island shape, i.e., each recess 50 is spaced from adjacent recesses 50, and a length of each recess 50 in a direction along the outer periphery of the light-emitting member 10 is less than a length of one side of the light-emitting member 10. Each of the recesses 50 includes an inner surface 50a facing the side surface 10c of the light-emitting member 10. The recess 50 reflects light which is reflected from the side surface 10c and propagates the light toward the side surface 10c. Thus, the quantity of light emitted from the side surface 10c is increased, and thus, it is possible to widen the light dispersion of the semiconductor light-emitting device 5.

In the examples shown in FIGS. 11A and 11B, a p-type semiconductor layer 12 between the side surface 10c of the light-emitting member 10 and the recess 50 is electrically connected to the p electrode 35. For this reason, it is preferable that a dielectric film 47 which covers the side surface 10c of the light-emitting member 10 is formed.

As discussed above, the aspects of the present disclosure has been described by referring to the specific examples. However, the embodiments of the present disclosure are not limited to these specific examples. That is, the design variations of these specific examples performed by a person skilled in the art may be included the scope of the present disclosure. The elements included in the specific examples described above, the arrangement, the materials, the conditions, the shapes, and the sizes thereof are not limited to the examples, but may be appropriately changed.

In the embodiments, it is assumed that the "nitride semiconductor" includes semiconductors having all compositions obtained by changing the range composition ratios x, y and z in a chemical formula of $B_xIn_yAl_zGa_{1-x-y-z}N$ ($0 \leq x \leq 1$, $0 \leq y \leq 1$, $0 \leq z \leq 1$, $x+y+z \leq 1$) within the respective ranges. Furthermore, it is assumed that the "nitride semiconductor" includes semiconductors which further include elements in group V other than N (nitride) in the aforementioned chemical formula, semiconductors which further include various elements added to control various properties such as a conductivity type, and semiconductors which further include various elements which are unintentionally included.

In the present disclosure, "on" as used in the phrase "a portion A is formed on a portion B" may include a case where the portion A is not in direct contact with the portion B, (e.g., the portion A is formed above the portion B) also a case where the portion A is in direct contact with the portion B (e.g., the portion A is formed directly on the portion B). The phrase "portion A is formed on the portion B" applies to a case where the portion A and the portion B are exchanged in position (e.g., along the layer stack direction) and the portion A is positioned above or under the portion B, and also applies to a case where the portion A and the portion B are arranged side by side (e.g., adjacent to each other in a same layer plane or the like). This is because even though the semiconductor light-emitting devices according to the embodiments are rotated, the structures of the semiconductor light-emitting devices are not changed before and after the rotation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor light-emitting device, the method comprising:
    forming a light-emitting member on a first substrate, the light-emitting member including a first semiconductor layer of a first conductivity type, a second semiconductor layer of a second conductivity type, and a light-emitting layer between the first semiconductor layer and the second semiconductor layer, the first semiconductor layer being positioned between the first substrate and the light-emitting layer;
    forming a first recess extending inwardly of the light-emitting member, the first recess extending through the second semiconductor layer and the light-emitting layer, the first recess having a bottom positioned in the first semiconductor layer;
    forming a first metal layer in the first recess, the first metal layer being electrically connected to the first semiconductor layer at the bottom of the first recess, the first metal layer being away from the second semiconductor layer and the light-emitting layer;
    forming a first dielectric layer over the first metal layer and the second semiconductor layer, the first dielectric layer including a portion electrically insulating the first metal layer in the first recess from the second semiconductor layer and the light-emitting layer, the first dielectric layer having an opening through which the second semiconductor layer is exposed;
    forming a second metal layer in the opening of the first dielectric layer, the second metal layer being electrically connected to the second semiconductor layer;
    forming a conductive layer over the first dielectric layer and the second metal layer;
    bonding a second substrate to the conductive layer; and
    removing the first substrate from the light-emitting member.

2. The method according to claim 1, further comprising:
    forming a reflective metal layer on the first dielectric layer and the second metal layer before forming the conductive layer.

3. The method according to claim 2, wherein the reflective metal layer includes silver.

4. The method according to claim 3, wherein the second metal layer includes silver.

5. The method according to claim 1, further comprising:
    forming a light extraction structure on the first semiconductor layer after removing the first substrate.

6. The method according to claim 5, wherein the first semiconductor has a roughened surface with fine protrusions.

7. The method according to claim 6, further comprising:
    forming a second dielectric layer over the roughened surface of the first semiconductor layer.

8. The method according to claim 7, wherein the second dielectric layer has a roughened surface with fine protrusions.

9. The method according to claim 1, wherein the first dielectric layer is formed in two steps by forming a first layer and by forming a second layer, the first layer being formed over the second semiconductor layer and an inner surface of the first recess before forming the first metal later, the second layer being formed over the first metal layer.

10. The method according to claim 1, wherein the first dielectric layer includes a second recess opposite to the first recess.

11. The method according to claim 10, further comprising:
    forming a reflective metal layer on the first dielectric layer, the reflective metal layer being positioned between the first dielectric layer and the conductive layer, the reflective metal layer covering an inner surface of the second recess.

12. The method according to claim 1, wherein the second substrate is electrically conductive.

* * * * *